(12) United States Patent
Vitale et al.

(10) Patent No.: US 12,199,144 B2
(45) Date of Patent: Jan. 14, 2025

(54) POWER SEMICONDUCTOR DEVICE AND MANUFACTURIING METHOD

(71) Applicant: Hitachi Energy Ltd, Zürich (CH)

(72) Inventors: Wolfgang Amadeus Vitale, Baar (CH); Luca De-Michielis, Aarau (CH); Chiara Corvasce, Bergdietikon (CH)

(73) Assignee: Hitachi Energy Ltd, Zürich (CH)

( * ) Notice: Subject to any disclaimer, the term of this patent is extended or adjusted under 35 U.S.C. 154(b) by 0 days.

(21) Appl. No.: 18/723,764

(22) PCT Filed: Nov. 22, 2022

(86) PCT No.: PCT/EP2022/082812
§ 371 (c)(1),
(2) Date: Jun. 24, 2024

(87) PCT Pub. No.: WO2023/117264
PCT Pub. Date: Jun. 29, 2023

(65) Prior Publication Data
US 2024/0379756 A1      Nov. 14, 2024

(30) Foreign Application Priority Data

Dec. 21, 2021  (EP) ..................... 21216358

(51) Int. Cl.
*H01L 29/06* (2006.01)
*H01L 29/417* (2006.01)
(Continued)

(52) U.S. Cl.
CPC .... *H01L 29/0696* (2013.01); *H01L 29/41766* (2013.01); *H01L 29/66348* (2013.01);
(Continued)

(58) Field of Classification Search
CPC .......... H01L 29/0696; H01L 29/41766; H01L 29/66348; H01L 29/66734; H01L 29/7397; H01L 29/7813
(Continued)

(56) References Cited

U.S. PATENT DOCUMENTS 8,120,098 B2    2/2012  Arai et al.
9,825,158 B2   11/2017  Corvasce
(Continued)

FOREIGN PATENT DOCUMENTS

EP      2953166 A1    12/2015
JP   2005-101551 A     4/2005

OTHER PUBLICATIONS

Geissmann et al., "Extraction of dynamic avalanche during IGBT turn off", Microelectronics Reliability, 2017, 6 pages.
(Continued)

*Primary Examiner* — Igwe U Anya
(74) *Attorney, Agent, or Firm* — Procopio, Cory, Hargreaves & Savitch LLP

(57) ABSTRACT

A power semiconductor device comprises a semiconductor body, a gate electrode, and an extraction electrode, wherein the semiconductor body comprises a source region of a first conductivity type, well region of a second conductivity type different from the first conductivity type at the gate electrode, a drift region which is of the first conductivity type, and a barrier region which is of the first conductivity type, the barrier region is located between the drift region and the extraction electrode.

14 Claims, 8 Drawing Sheets

Figure 1:
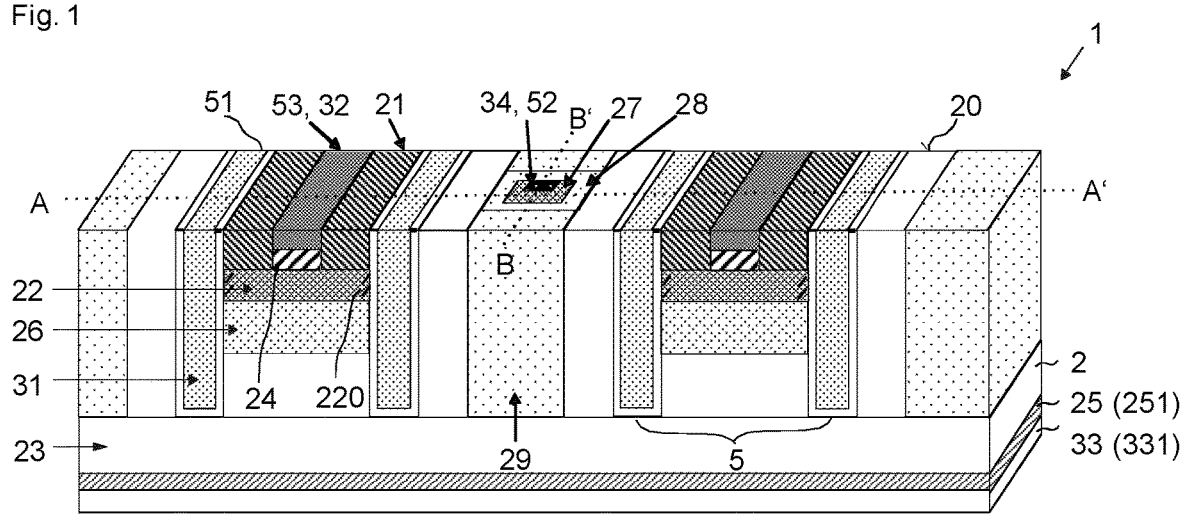

(51) Int. Cl.
  *H01L 29/66* (2006.01)
  *H01L 29/739* (2006.01)
  *H01L 29/78* (2006.01)

(52) U.S. Cl.
  CPC .... *H01L 29/66734* (2013.01); *H01L 29/7397* (2013.01); *H01L 29/7813* (2013.01)

(58) Field of Classification Search
  USPC .................................................... 257/330
  See application file for complete search history.

(56) References Cited

U.S. PATENT DOCUMENTS

| | | | |
|---|---|---|---|
| 2016/0056148 A1* | 2/2016 | Kanno | ............... H01L 29/1095 257/139 |
| 2016/0247910 A1 | 8/2016 | Suzuki et al. | |
| 2016/0352326 A1* | 12/2016 | Laven | ................. H01L 27/0727 |
| 2016/0359026 A1 | 12/2016 | Matsuura | |
| 2017/0033206 A1 | 2/2017 | Matsuura | |
| 2019/0019861 A1 | 1/2019 | Naito | |
| 2019/0181254 A1* | 6/2019 | Nagata | ................. H01L 29/1095 |
| 2019/0189756 A1* | 6/2019 | Okumura | ............ H01L 29/1608 |

OTHER PUBLICATIONS

Laska et al, "Long Term Stability and Drift Phenomena of different Trench IGBT Structures under Repetitive Switching Tests", Proceedings of the 19th International Symposium on Power Semiconductor Devices & ICs May 27-30, 2007 Jeju, Korea, 4 pages.

International Search Report and Written Opinion for the PCT Application No. PCT/EP2022/082812 dated Feb. 13, 2023, 15 pages.

* cited by examiner

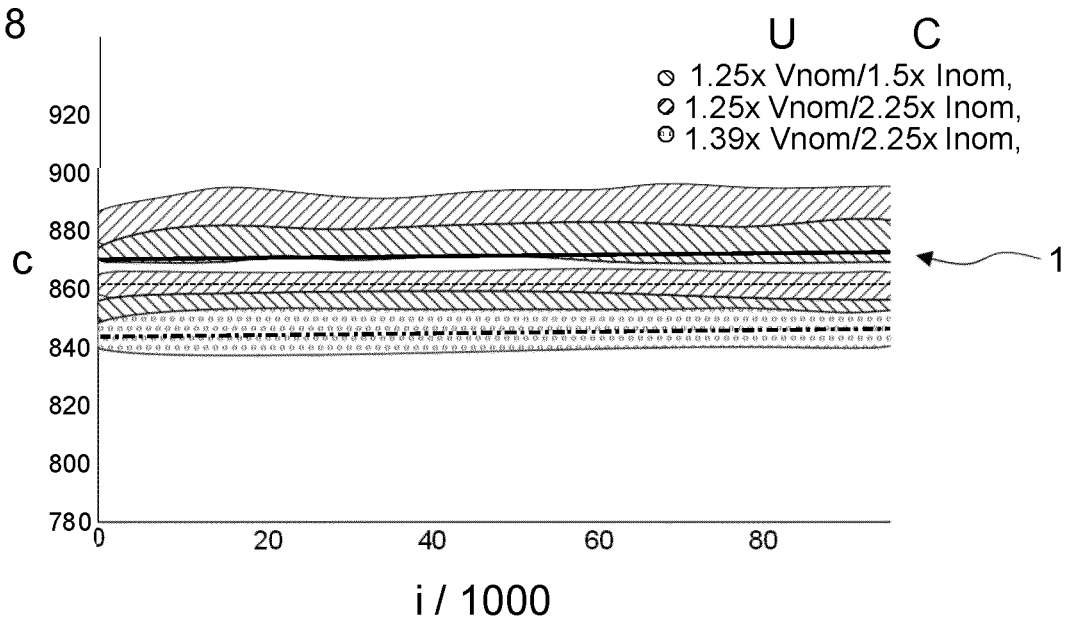
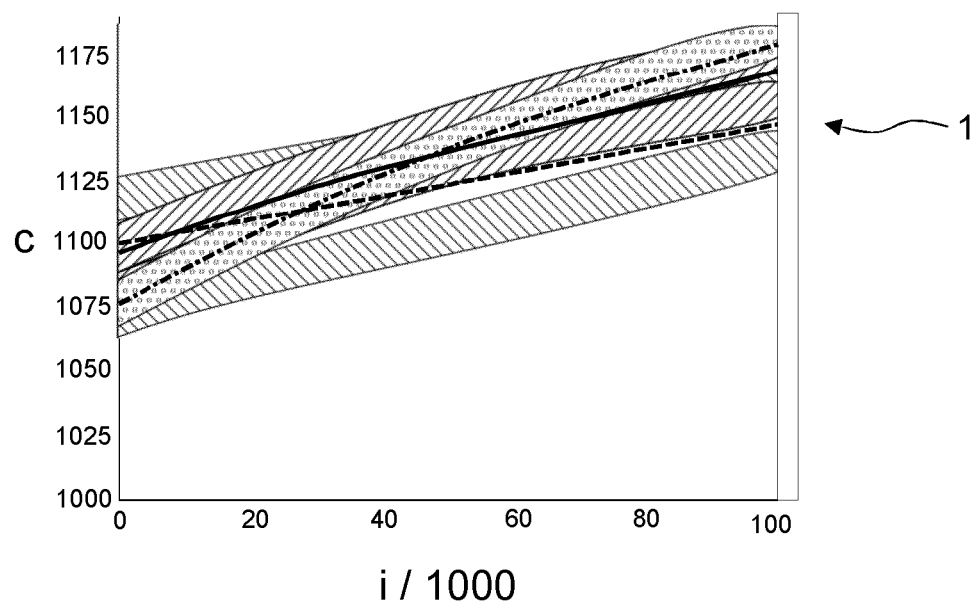

POWER SEMICONDUCTOR DEVICE AND MANUFACTURIING METHOD

The present application is a national stage entry of International Patent Application No. PCT/EP2022/082812, filed on Nov. 22, 2022, the disclosures of which are hereby incorporated herein by reference as if set forth in full.

A power semiconductor device is provided. A method for manufacturing such a power semiconductor device is also provided.

Document U.S. Pat. No. 9,825,158 B2 discloses an insulated-gate bipolar transistor.

Document U.S. Pat. No. 8,210,098 B2 refer to a trench insulated-gate bipolar transistor.

Documents EP 2 953 166 A1, US 2017/033206 A1, US 2019/019861 A1, US 2016/359026 A1 and US 2016/247910 A1 refer to semiconductor devices.

A problem to be solved is to provide a power semiconductor device that has improved electrical behavior.

Embodiments of the disclosure relate to a power semiconductor device and a method as defined in the independent patent claims. Exemplary further developments constitute the subject-matter of the dependent claims.

For example, the power semiconductor device comprises an extraction electrode which is separated from a drift region by means of a barrier region. By means of the barrier region, an improved trade-off between long-term stability, in particular in view of robustness to gate insulator degradation, and static loss can be achieved.

In at least one embodiment, the power semiconductor device comprises a semiconductor body, a gate electrode and an extraction electrode, wherein the semiconductor body comprises:
- a source region of a first conductivity type, a source electrode is located at the source region,
- a well region of a second conductivity type different from the first conductivity type at the gate electrode,
- a drift region which is of the first conductivity type, and
- a barrier region which is of the first conductivity type, the barrier region is located between the drift region and the extraction electrode, and the extraction electrode is assigned to the barrier region.

For example, that the extraction electrode is assigned to the barrier region can mean that the respective extraction electrode is located within a closed ring formed by the assigned barrier region, seen in top view of a top side of the semiconductor body. Alternatively or additionally, the respective extraction electrode is the electrode in direct electric contact with the semiconductor body and closest to the barrier region.

The gate electrode is insulated from the semiconductor body by the gate insulator. The gate insulator is made of any electrically insulating material, which may be an oxide. For example, the gate insulator may be of at least one of the following materials: $SiO_2$, $Si_3N_4$, $Al_2O_3$, $Y_2O_3$, $Zro_2$, $HfO_2$, $La_2O_3$, $Ta_2O_5$, $TiO_2$. Hence, the gate insulator may also be referred to as gate oxide. For example, a thickness of the gate insulator is at least 50 nm and/or at most 0.5 µm.

For example, the semiconductor body is of silicon, Si for short. However, the semiconductor body can alternatively be of a wide-bandgap semiconductor material like SiC, $Ga_2O_3$ or GaN.

The first conductivity type is, for example, n-conductive and, thus, the source region and the drift region as well as the barrier region are n-doped. In this case, the second conductivity type is p-conductive and, thus, the well region is p-doped. Otherwise, the first conductivity type is p-conductive and the second conductivity type is n-conductive. In the following, the focus is on the first case, that is, the first conductivity type is n-conductive and the second conductivity type is p-conductive, however, all the following statements also apply analogously for the case in which the first conductivity type is p-conductive and the second conductivity type is n-conductive. It is possible that a maximum doping concentration of the well region is less than a maximum doping concentration of the source region and/or that the maximum doping concentration of the well region is larger than a maximum doping concentration of the drift region.

When the power semiconductor device is in an on-state, the well region is configured to provide a channel region, in cooperation with the gate insulator and the gate electrode. For example, the well region is in direct contact with the gate insulator. Hence, the channel region is part of the well region and may have the same doping concentration. During operation, and when the second conductivity type is p-conductive, the electrons flow in the channel region from the source region to the drift region along the gate insulator. The channel region has a thickness in a direction perpendicular to an interface between the gate insulator and the well region, for example, in a nanometer range, exemplarily 1 nm to 50 nm.

According to at least one embodiment, the power semiconductor device is configured for a maximum voltage of at least 0.6 kV or of at least 1.2 kV or of at least 3 kV. This voltage is applied in regular use of the device, for example, between a drain electrode and an emitter electrode or between a source electrode and a drain electrode. That is, by means of the gate electrode and by having the respective voltages between the source/emitter and drain/collector electrodes, a flow of current through the power semiconductor device can be controlled, in particular can be switched on and off.

The power semiconductor device is, for example, for a power module in a vehicle to convert direct current from a battery or a fuel cell to alternating current for an electric motor, for example, in hybrid vehicles or plug-in electric vehicles or also in railways, like commuter trains.

According to at least one embodiment, the power semiconductor device is a metal-insulator-semiconductor field-effect transistor, MISFET, a metal-oxide-semiconductor field-effect transistor, MOSFET, or an insulated-gate bipolar transistor, IGBT or a reverse-conducting insulated-gate bipolar transistor, RC-IGBT.

According to at least one embodiment, the semiconductor body further comprises an extraction region. For example, the extraction region is located at the extraction electrode. It is possible that the extraction electrode is in contact with the semiconductor body only by means of the extraction region. Thus, the extraction region can be located between the barrier region and the extraction electrode and can be in direct contact with both the barrier region and the extraction electrode. The extraction region is of the second conductivity type.

According to at least one embodiment, the semiconductor body further comprises a deep doping region which is of the second conductivity type. For example, the deep doping region is located between the barrier region and at least part of the drift region. It is possible that the deep doping region is located directly at the barrier region and that the barrier region separates the deep doping region from the extraction region and the extraction electrode. Further, it is possible that part of the drift region is located between the barrier region and the deep doping region so that the deep doping region may be sandwiched between different parts of the drift region.

According to at least one embodiment, a depth of the deep doping region into the semiconductor body is equal to or exceeds a depth of the well region. For example, the depth of the deep doping region exceeds the depth of the well region by at least a factor of 1.5 or by at least a factor of 2 and/or by at most a factor of 20 or by at most a factor of 10.

The term 'depth' may refer to an extent of the respective component in a direction perpendicular to a top side of the semiconductor body. For example, the top side is opposite a collector electrode or a drain electrode of the power semiconductor device.

According to at least one embodiment, a bottom side of the barrier region is partially or completely free of the deep doping region. The bottom side is a side of the barrier region facing away from the top side. In other words, a region below the barrier region can completely or partially be free of the deep doping region.

According to at least one embodiment, the semiconductor body further comprises an enhancement region which is of the first conductivity type. For example, the enhancement region is located directly at a bottom side of the well region so that the enhancement region is located between the drift region and the well region. That is, the enhancement region can be assigned to the well region. If there is no enhancement region, then the well region can be in direct contact with the drift region, for example, at the bottom side of the well region.

According to at least one embodiment, the gate electrode is partially or completely accommodated in a trench. For example, the trench is completely filled with the gate electrode and the gate insulator between the gate electrode and the semiconductor body.

According to at least one embodiment, the gate electrode and the trench extend deeper into the semiconductor body than the well region. For example, a depth to the gate electrode exceeds the depth of the well region by at least a factor of 1.5 or by at least a factor of 2 and/or by at most a factor of 10 or by at most a factor of 5.

According to at least one embodiment, the depth of the deep doping region is equal to or larger than a depth of the gate electrode.

According to at least one embodiment, seen in top view of the semiconductor body, the gate electrode comprises 2N stripes or 2N+1 stripes, wherein N is a natural number larger than or equal to one. For example, $2 \leq N \leq 200$ or $5 \leq N \leq 50$ applies. The stripes define N active cells of the power semiconductor device. In other words, the active cell, or each one of the active cells, comprise/comprises two of the stripes and the associated source region and well region.

According to at least one embodiment, the extraction electrode comprises a plurality of contact points. For example, seen in top view of the semiconductor body, the contact points are arranged in each case between two adjacent active cells. It is possible that the contact points between the respective two active cells are arranged along an arrangement line which can be a straight line. For example, the arrangement line is a line of mirror symmetry of the two assigned active cells, seen in top view.

According to at least one embodiment, the contact points fill at most 10% or at most 5% of a length of the arrangement line. Hence, the contact points make only a small portion of the arrangement line.

According to at least one embodiment, a length of each one of the contact points along the arrangement line is at most 70% or at most 50% or at most 30% of a distance between the adjacent active cells. The same may alternatively or additionally apply for a width of the contact points perpendicular to the arrangement line.

According to at least one embodiment, the source region and the extraction electrode are configured to be at the same electric potential. For example, the source region is in ohmic electric contact with the extraction electrode. Hence, the extraction electrode and a source electrode may electrically be shorted.

A method for manufacturing the power semiconductor device is additionally provided. For example, by means of the method, a power semiconductor device is produced as indicated in connection with at least one of the above-stated embodiments. Features of the power semiconductor device are therefore also disclosed for the method and vice versa.

In at least one embodiment, the method comprises the following steps, for example, in the stated order:
providing a semiconductor body having a drift region which is of a first conductivity type,
creating an enhancement region and/or a barrier region which are of the first conductivity type,
creating a well region and/or an extraction region which are of a second conductivity type different from the first conductivity type,
creating a source region which is of the first conductivity type, and
applying a gate electrode at the well region and an extraction electrode, the barrier region is located between the drift region and the extraction electrode.

According to at least one embodiment, the enhancement region and the barrier region are created simultaneously. That is, the enhancement region and the barrier region can be produced with the same doping step which is, for example, implantation of ions to introduce the doping.

According to at least one embodiment, the well region and the extraction region are created simultaneously. That is, the well region and the extraction region can be produced with the same doping step which is, for example, implantation of ions to introduce the doping.

For example, the enhancement region and the barrier region on the one hand and the well region and the extraction region on the other hand have the same dopants and/or the same maximum doping concentrations and/or the same depth profile of the doping, respectively.

A power semiconductor device and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

IN THE FIGURES

Figure 2:
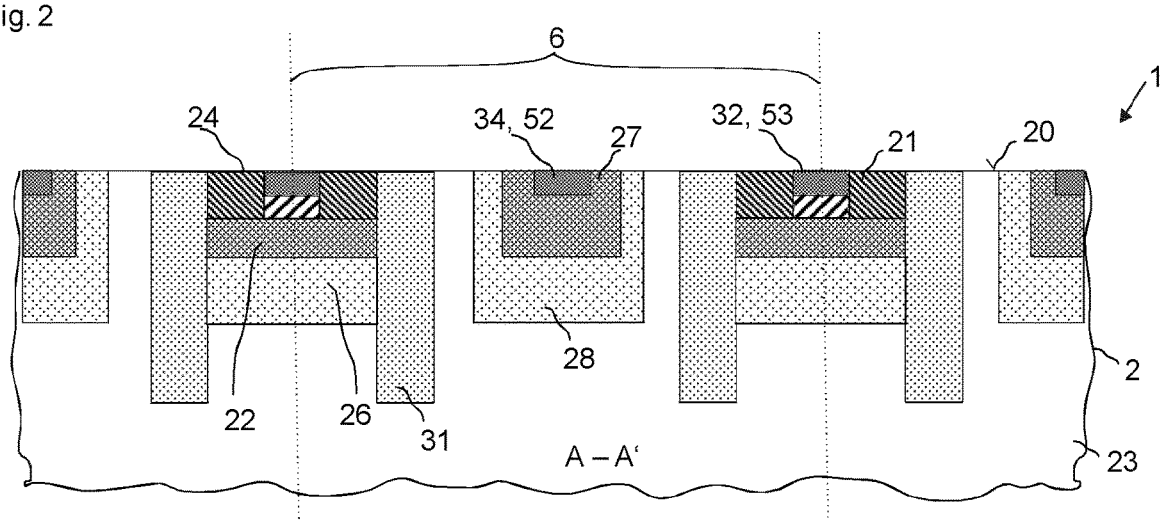
Figure 3:
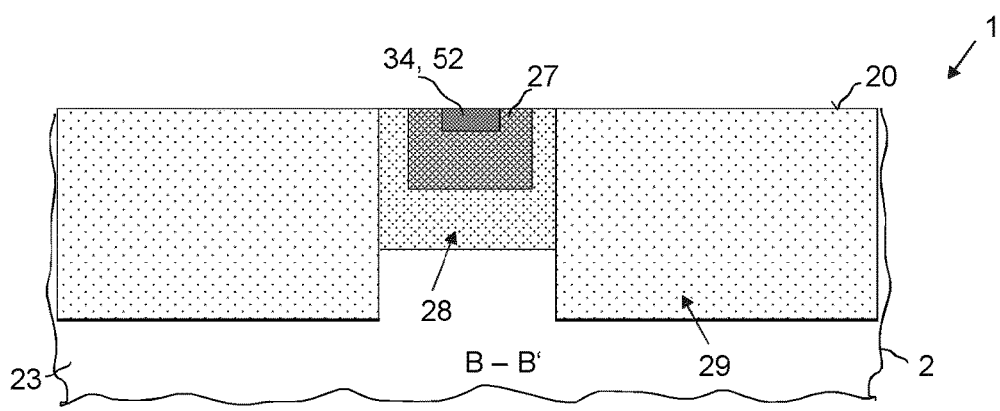
Figure 4:
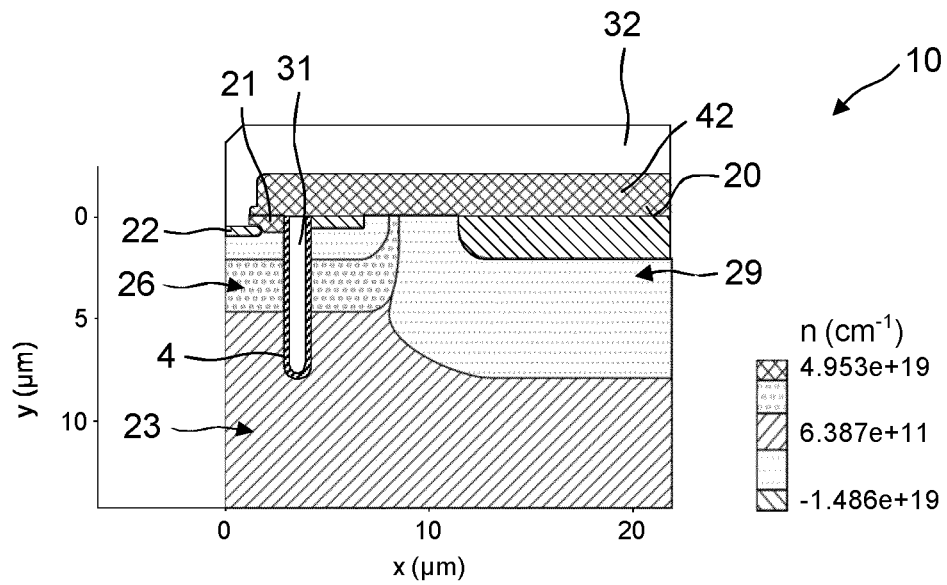
Figure 5:
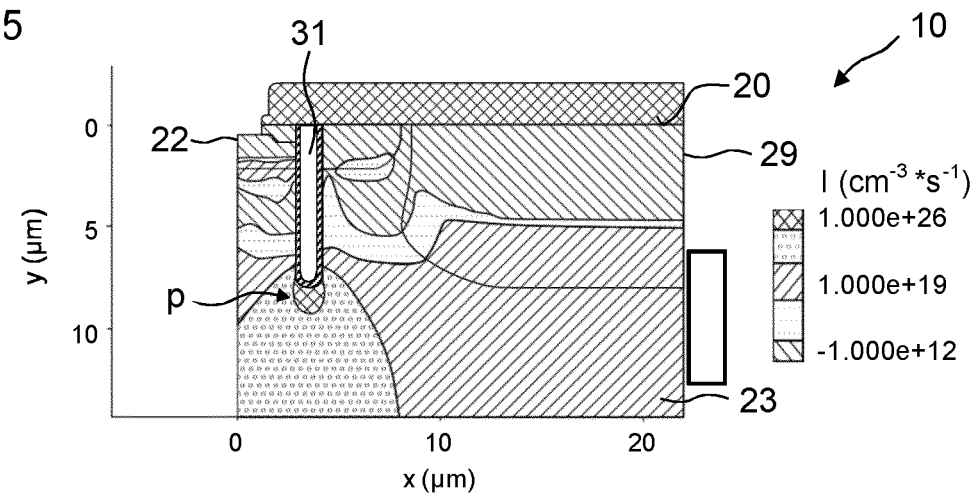
Figure 6:
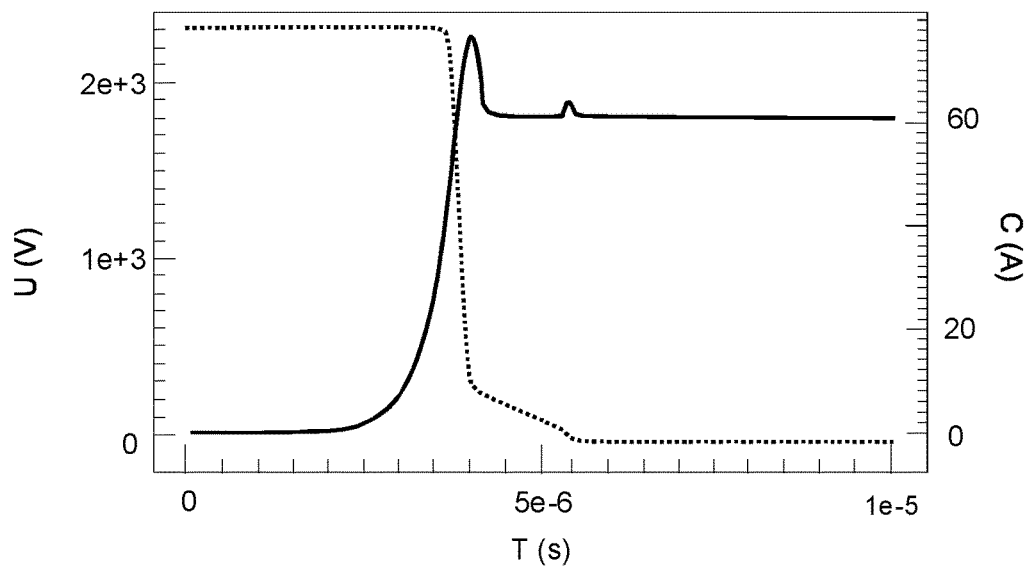
Figure 7:
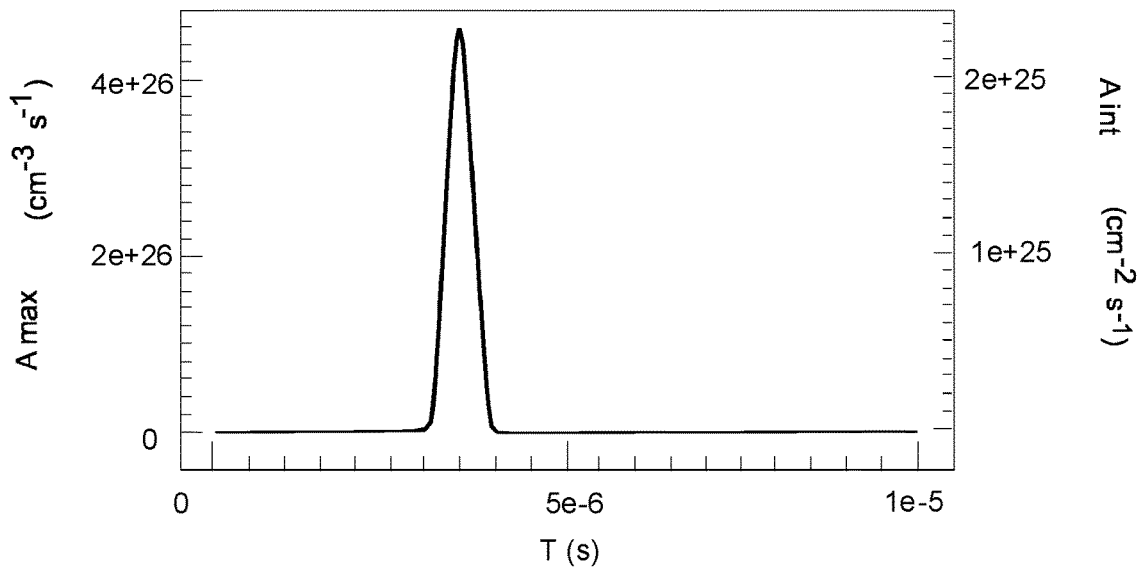
Figure 10:
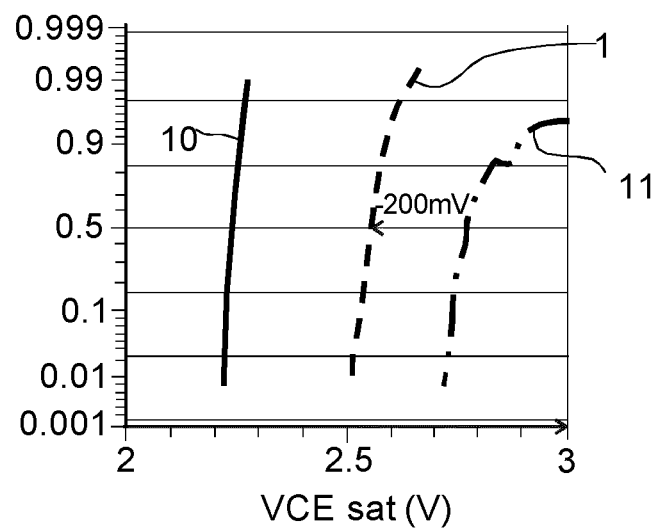
Figure 11:
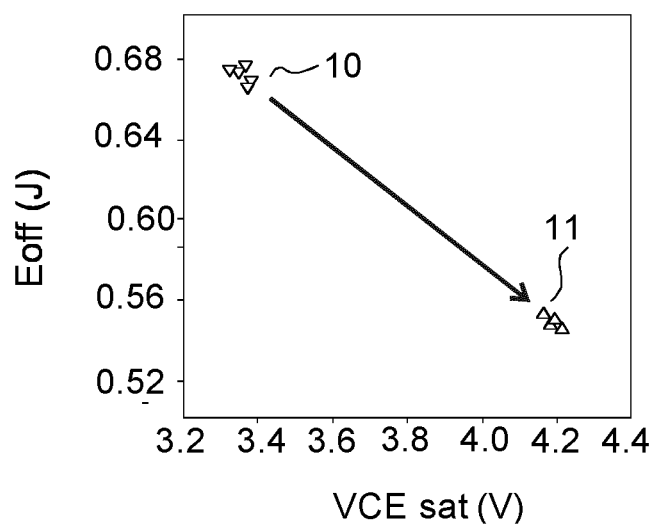
Figure 12:
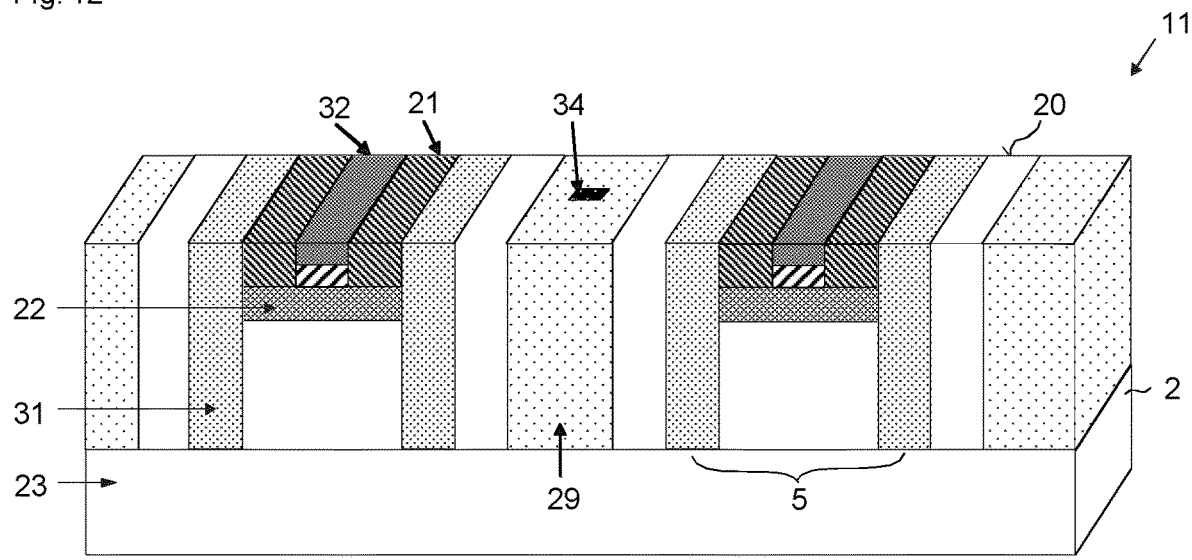
Figure 13:
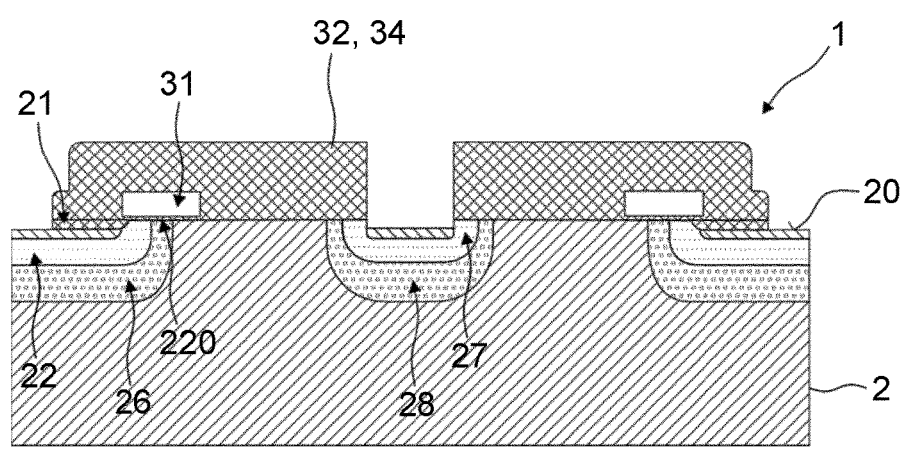
Figure 14:
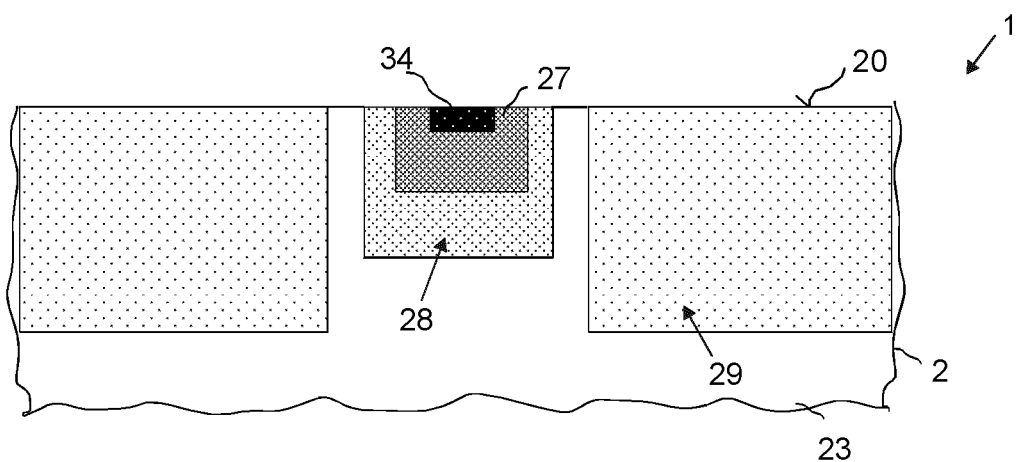
Figure 15:
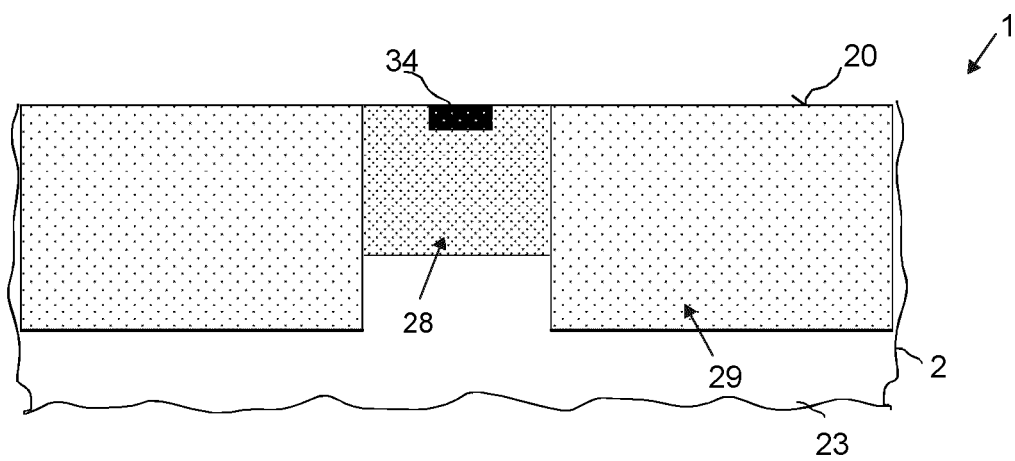
Figure 16:
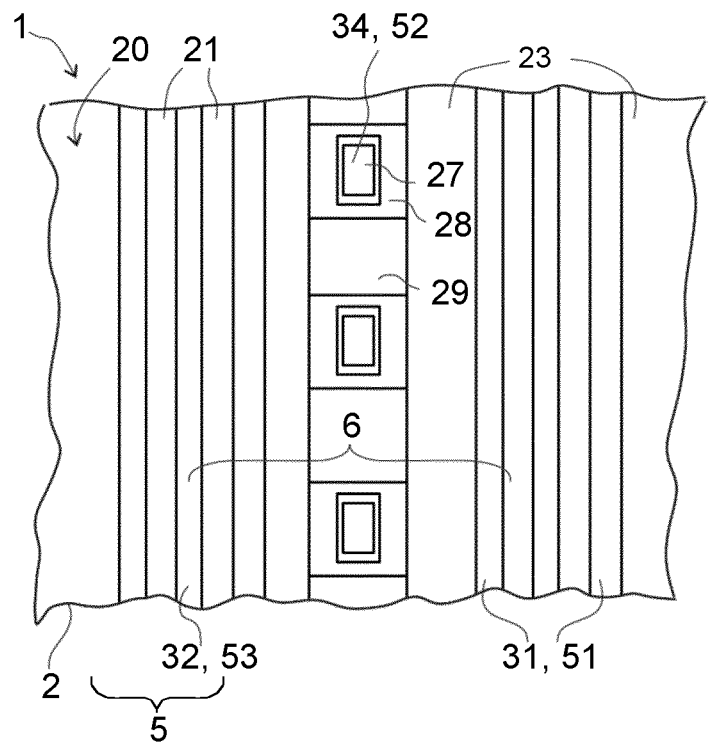
Figure 17:
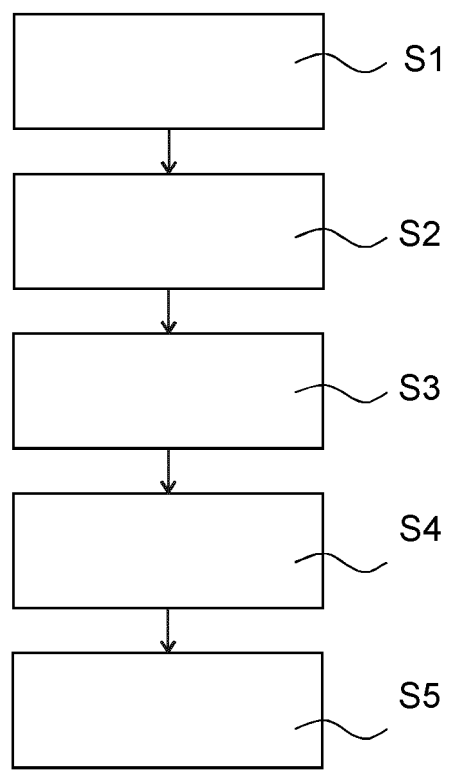

FIG. 1 is a schematic perspective view of an exemplary embodiment of a power semiconductor device described herein, FIGS. 2 and 3 are schematic sectional views of the power semiconductor device of FIG. 1, FIGS. 4 and 5 are schematic sectional views of a modified power semiconductor device, FIGS. 6 and 7 are schematic illustrations of a switching process of the modified power semiconductor device of FIGS. 4 and 5, FIGS. 8 and 9 are illustrations of comparison data concerning long-term switching stability of an exemplary embodiment of a power semiconductor device described herein and a modified power semiconductor device, FIGS. 10 and 11 are illustrations of comparison data concerning an exemplary embodiment of a power semiconductor device described herein and modified power semiconductor devices, FIG. 12 is a schematic perspective view of a modified power semiconductor device, FIGS. 13 to 15 are schematic sectional views of exemplary embodiments of power semiconductor devices described herein, FIG. 16 is a schematic top view of an exemplary embodiment of a power semiconductor device described herein, and FIG. 17 is a block diagram of an exemplary embodiment of a method to manufacture power semiconductor devices described herein.

FIGS. 1 to 3 illustrate an exemplary embodiment of a power semiconductor device 1. The power semiconductor device 1 comprises a semiconductor body 2 which is, for example, of Si or of SiC. In the semiconductor body 2, there is a drift region 23 that may laterally extend across the whole semiconductor body 2, that is, for example, in directions in parallel with a top side 20 of the semiconductor body 2. The drift region 23 is of a first conductivity type, for example, the drift region is n-doped.

Moreover, at the top side 20, the semiconductor body 2 comprises a source region 21 which is also of the first conductivity type, but with a maximum doping concentration higher than that of the drift region 23. The source region 21 is electrically contacted by means of a source electrode 32. The source electrode 32 may be applied on a top side 20 of the semiconductor body 2 or may be partially or completely located in a recess formed at the top side 20 into the semiconductor body 2.

The source region 21 can be divided in a plurality of sub-regions. However, because all the sub-regions work in the same way and may be on the same electric potential, for simplicity in the following only one source region 21 is explicitly referred to although there can be independent sub-regions or even electrically independent source regions, not shown. The same applies analogously to all other regions of the semiconductor body 2.

Further, the semiconductor body 2 comprises a well region 22, for example, below the source region 21. The well region 22 is of a second conductivity type, for example, the well region 22 is p-doped. The well region 22 is located at a gate electrode 31 which is accommodated in trenches. The gate electrode 34 is electrically separated from the semiconductor body 2 by means of a gate insulator 4; for simplicity, the gate insulator 4 is only illustrated in FIG. 1. As an option, the trenches may run in parallel with each other.

Along the gate electrode 34, in operation of the power semiconductor device 1 a channel region 220 forms in which charge carrier conduction occurs. The gate electrode 34 extends deeper into the semiconductor body 2 than the well region 22. By two trenches and the source region 21 having, for example, two sub-regions, as well as by the well region 22 located between said two trenches, an active cell 5 is formed. It is possible that there is a plurality of the active cells 5, as illustrated in FIG. 1, or that there is only one active cell 5.

As an option there is a plug 24 to electrically contact the well region 22. The plug 24 may be located below the source electrode 32 and may be electrically contacted by the source electrode 32 so that the source region 21 and the plug 24 are on the same electric potential. Such a plug 24 can also be present in all other exemplary embodiments.

As a further option, the semiconductor body 2 comprises an enhancement region 26 which is of the first conductivity type. The enhancement region 26 is on a side of the well region 22 remote from the top side 20. For example, the enhancement region 26 completely extends between the two assigned trenches, seen in cross-section A-A', compare FIG. 2. The gate electrode 31 may extend deeper into the semiconductor body 2 than the enhancement region 26. A maximum doping concentration of the enhancement region 26 may exceed a maximum doping concentration of the drift region 23.

For example, the power semiconductor device 1 is an insulated-gate bipolar transistor, IGBT for short. Hence, at a side of the drift region 23 remote from the well region 22, there is a collector region 25 which is of the second conductivity type, too. At the collector region 25, there is a collector electrode 33. Additionally, as a further option there can be a buffer region of the first conductivity type between the drift region 23 and the collector region 25, not shown. The doping concentration of such a buffer region can be higher than that of the drift region 23.

Otherwise, if the power semiconductor device 1 is a field-effect transistor, then there is a drain region 251 instead of the collector region 25, and the collector electrode 33 is replaced with a drain electrode 331. This is illustrated in FIG. 1 by means of the brackets around the reference signs 251, 331. Contrary to the collector region 25, the drain region 251 is of the first conductivity type.

In the other Figures, the collector region 25 and the collector electrode 33, or the drain region 251 and the drain electrode 331, are not shown, and the respective devices could either be an IGBT or a field-effect transistor.

Seen in top view of the top side 20, the gate electrode 31 may comprise a plurality of stripes 51, two of the stripes 51 define one of the active cells 5. In between two stripes 51 of a respective active cell 5, there is a line 53 of the source electrode 32. Optionally, the line 53 and the plug 24 can be congruent.

In the embodiment of FIGS. 1 to 3, the plurality of active cells 5 is arranged as an array of stripes; in other words, the active cells 5 have a main direction of extension parallel to the top surface 20 and/or parallel to one another. In another exemplary embodiment not shown in the figures, it is also possible that the plurality of active cells 5 is arranged as a cellular array. That is, the active cells 5 may be arranged in a two-dimensional grid, seen in top view of the top side 20, For example, in a rectangular or hexagonal grid.

Moreover, the power semiconductor device 1 comprises an extraction electrode 34. The extraction electrode 34 can comprise or can be composed of a plurality of contact points 52 which are located between adjacent active cells 5 or, if there is only one active cell 5, on sides of the trenches remote from the source electrode 32. Further, near the extraction electrode 34, the semiconductor body 2 comprises a barrier region 28 which is of the first conductivity type. The barrier region 28 may form a well within which the extraction electrode 34 is located. Thus, all current to and/or from the extraction electrode 34 has to pass the barrier region 28 in intended use of the power semiconductor device 1.

As an option, if there is a plurality of extraction electrodes 34 and/or a plurality of respective contact points 52, only one or some of the extraction electrodes 34 and/or the contact points 52 need to be provided with the barrier region 28. In other words, there can be a mixture of extraction electrodes 34 and/or respective contact points 52 provided with the barrier regions 28 and extraction electrodes 34 and/or contact points 52 not provided with a barrier region. However, preferably all of the extraction electrodes 34 and/or respective contact points 52 are provided with the at least one barrier region 28.

As an option, directly at the extraction electrode 34 the semiconductor body 2 comprises an extraction region 27 which is of the second conductivity type. The extraction electrode 34 may only be in direct contact with the extraction region 27. On sides of the extraction region 27 facing away from the extraction electrode 34, the extraction region 27 may be surrounded all around by the barrier region 28, see the cross-sections A-A' and B-B' as illustrated in FIGS. 2 and 3. Thus, the barrier region 28 may form a well in which the extraction region 27 is located.

As a still further option, the semiconductor body 2 comprises a deep doping region 29 which is of the second conductivity type. For example, the deep doping region 29 is located along an arrangement line of the contact points 52. Hence, sides of the barrier region 28 facing the trenches with the gate electrode 31 can be free of the deep doping region 29. Further, a bottom side of the barrier region 28 remote from the top side 20 can also be free of the deep doping region 29, compare FIG. 3. In a direction in parallel with the trenches, see the cross-section B-B' in FIG. 3, the deep doping region 29 may directly adjoin the barrier region 28.

For example, for maximum doping concentrations of the different regions of the semiconductor body 2, the following applies, individually or in any combination:
- source region 21, plug 24, deep doping region 29, collector region 25 and/or drain region 251: at least $1 \times 10^{18}$ cm$^{-3}$ or at least $5 \times 10^{18}$ cm$^{-3}$ or at least $1 \times 10^{19}$ cm$^{-3}$ and/or at most $5 \times 10^{20}$ cm$^{-3}$ or at most $2 \times 10^{20}$ cm$^{-3}$ or at most $1 \times 10^{20}$ cm$^{-3}$;
- well region 22, enhancement region 26, extraction region 27 and/or barrier region 28, at least $5 \times 10^{16}$ cm$^{-3}$ or at least $1 \times 10^{17}$ cm$^{-3}$ and/or at most $5 \times 10^{19}$ cm$^{-3}$ or at most $5 \times 10^{18}$ cm$^{-3}$;
- drift region 23, depending on the voltage class of the power semiconductor device 1, at least $1 \times 10^{11}$ cm$^{-3}$ or at least $1 \times 10^{12}$ cm$^{-3}$ or at least $1 \times 10^{13}$ cm$^{-3}$ and/or at most $1 \times 10^{17}$ cm$^{-3}$ or at most $5 \times 10^{16}$ cm$^{-3}$ or at most $1 \times 10^{16}$ cm$^{-3}$.

For example, a maximum doping concentration of the deep doping region 29 exceeds a maximum doping concentration of the well region 22 by at least a factor of two. Alternatively or additionally, a maximum doping concentration of the enhancement region 26 exceeds a maximum doping concentration of the drift region 23 by at least a factor of 10 or by at least a factor of 100.

Referring to FIG. 2, in which a plurality of the active cells 5 are illustrated, in an alternative view a unit cell 6 may be defined including two halves of the nearby active cells 5 as well as the structure including the regions 27, 28, 29 and the extraction electrode 34. The power semiconductor device 1 may include a plurality of the unit cells 6 arranged as an array of stripes as described above for the active cells 5.

By means of the barrier region 28, an improved trade-off between long-term stability, in particular in view of robustness to gate insulator degradation, and static loss can be achieved. The barrier region can thus work together with the extraction region 27 and the deep doping region 29. The function of the barrier region 28 is explained in the following with regard to modifications 10, 11 of the semiconductor device in more detail.

In FIG. 4, a first modification 10 of the power semiconductor device 1 of FIGS. 1 to 3 is illustrated. The main difference between the devices 1, 10 is that the modification 10 is free of the barrier region. Further, the first modified device 10 does not include an extraction region and does not include a separate contact point for an extraction electrode. In FIG. 5, an impact ionization during turn off of the modification 10 of FIG. 4 is illustrated.

As an option, the enhancement region 26 and the well region 22 can be on both side of the trench. In other words, the trench and, hence, the gate electrode 31 can run through the enhancement region 26 and the well region 22 starting from the top side 20. A field oxide 42 separates the source electrode 32 from the semiconductor body, and the source electrode 32 extends over the top side 20. These features could individually or collectively also be realized in the power semiconductor device 1 described herein. Otherwise, the same as to FIGS. 1 to 3 may also apply to FIG. 4, and vice versa.

Long-term performance stability of, for example, IGBTs requires robustness to gate insulator degradation. Gate insulator degradation can be caused by dynamic avalanche during turn-off switching events at high currents: charge carriers generated by dynamic avalanche may have enough energy to be injected into the gate insulator, modifying a gate capacitance and so the switching characteristics of the device, like a switching speed, and may cause threshold voltage instabilities. Degradation is a design challenge for trench IGBTs, due to the peak P of avalanche generation near the gate insulator at the bottom of the trench, see FIG. 5.

In FIG. 6, a current-voltage curve during turn off of the IGBT of FIG. 4 which is configured for a voltage of 3.3 kV is shown, and FIG. 7 shows an integrated avalanche generation Aint and a maximum avalanche generation Amax during turn-off. It can thus be seen that during turn-off significant avalanche generation occurs.

A way to improve the robustness to gate oxide degradation in IGBTs is to decrease an anode dose. However, decreasing the anode dose has also a detrimental effect on the static loss and the short circuit safe operation area, SOA, capability. Another solution is to implement protection structures such as deep doping regions 29, like deep p-wells, as shown in FIG. 4, and/or to form dummy trenches. In this way, the dynamic avalanche generation near the active trench may be reduced, but not in a way sufficient to ensure long-term stability for highly demanding applications with high-frequency harsh switching conditions.

A more effective approach to reduce degradation would be to include additional electrical contacts at a distance from the active cells 5, like the extraction electrode 34. The additional contacts are biased in a way to be able to extract a part of the plasma during turn-off, effectively diverting carriers away from the active trench and so reducing the avalanche generation near the gate oxide. For instance, emitter biased contacts directly connected to the p-well would divert a considerable amount of current from a backside while depleting the plasma during turn-off.

However, directly connecting the deep doping region 29 with an emitter contact 34 can be an impractical solution as it would greatly increase the static loss. This undesired effect is due to the fact that the additional contacts provide additional extraction points for charge carriers, reducing the plasma density and so the conductivity for the same applied collector-emitter voltage.

With the power semiconductor device 1 described herein, an improved trade-off between long-term performance stability, that is, robustness to gate insulator degradation, and static loss can be achieved. Differently from other solutions, the additional extraction contacts 34 are effectively shielded by the barrier region 28, which reduces the detrimental effect of the contacts 34 on the on-state while keeping the benefits in terms of reduced turn-off loss and improved robustness to gate oxide degradation.

With the power semiconductor device 1 described herein, which is, for example, a 3.3 kV trench IGBT, an improved robustness to degradation with a limited increase in static loss as compared to alternative solutions can be achieved. The power semiconductor device 1 can be processed without an aggressive technology development, as, for example, the only required change is a modified layout of the masks used for the photolithography steps performed to form the contact points to the top surface.

FIGS. 8 and 9 show the results of a repetitive reverse bias safe operation area, RBSOA, test to compare the robustness to degradation in a power semiconductor device 1 described herein in connection with FIG. 1, compare FIG. 8, and a modified design 10 similar to that described in FIG. 4 without a barrier region, compare FIG. 9.

In FIGS. 8 and 9, an increase in a maximum current overshoot during turn-on is measured every 1000 turn-off pulses i, up to a maximum of 100k pulses. The experiment has been repeated at increasingly harsh turn-off conditions, up to a maximum of 1.39x the nominal voltage U of 2.5 kV and up to 2.25x the nominal current C of 337.5 A, both in FIG. 8 and in FIG. 9. The upper and lower limits of the C-axis are at a +/−10% offset from the initial maximum current overshoot.

The power semiconductor device 1 described herein shows no signs of degradation even in the harshest tested conditions, while the device 10 shows increasing effects of degradation with increasing turn-off voltage. The results of FIGS. 8 and 9 prove that the barrier region 28 does not limit the effectiveness of the extraction electrode 34 in terms of robustness to degradation.

FIG. 10 shows a probability plot of the on-state voltage VCEsat at room temperature for three device splits processed in parallel in the same lot. The power semiconductor device 1 described herein offers an improvement in VCEsat of about 200 mV compared to a second modified device 11 in which the extraction contact is not completely surrounded by a barrier region. As a reference, the first modified device 10 without extraction contact, affected by degradation, is included in the analysis, too.

Thus, the presence of the barrier region 28 completely surrounding the extraction electrode 34 allows to obtain a significant reduction in VCEsat with respect to the device 11 in which the extraction layer is directly connected to the deep p-well. The power semiconductor device 1 described herein does still have higher static loss than the device 10 without additional extraction contacts, but to a lesser extent.

In FIG. 11, the device 10 with no extraction contacts similar to that of FIG. 4 is compared with the device 11 in which the extraction contact is not completely surrounded by a barrier region, both the devices 10 and 11 being configured as 6.5 kV trench IGBT. In presence of the additional extraction electrode 34, a higher voltage VCEsat is needed to obtain the plasma density required to reach the nominal on-state current. On the other hand, turn-off losses Eoff are reduced.

The power semiconductor device 1 described herein has a lower switching loss than the device 10 which has no extraction contacts, but a slightly higher switching loss than the device 11. Thus, the power semiconductor device 1 described herein effectively moves in regions of the technology curve optimized for high frequency applications without having to reduce the anode injection efficiency with potentially reduced short circuit capability.

For comparison, in FIG. 12 the emitter side of the modification 11 of a trench IGBT to which reference is made above is illustrated. The emitter-biased contact 34 is directly connected to the deep doping region 29 in between the active cells 5. This additional contact 34 can be thought as a hole extraction contact. It helps increasing robustness to degradation but it has a strong detrimental effect on static loss.

In FIG. 13, another example of the power semiconductor device 1 is illustrated in which there is no trench gate electrode, but the gate electrode 31 is applied on the top side 20. Thus, the power semiconductor device 1 of FIG. 13 is of planar design.

In FIG. 13 it can be seen that the optional enhancement region 26 and the barrier region 28 can have the same doping profile. This can be achieved by producing the enhancement region 26 and the barrier region 28 in the same method step. The same is true for the well region 22 and the optional extraction region 27. Further, as an option, the deep doping region does not need to be present.

Otherwise, the same as to FIGS. 1 to 12 may also apply to FIG. 13, and vice versa.

The cross-sections of FIGS. 14 and 15 correspond to the representation of FIG. 3. In FIG. 14 it is illustrated that the drift region 23 may extend between the deep doping region 29 and the barrier region 28. According to FIG. 15, there is no extraction region but the barrier region 28 is in direct contact with the extraction electrode 34.

Otherwise, the same as to FIGS. 1 to 13 may also apply to FIGS. 14 and 15, and vice versa.

In FIG. 16, a top view of an exemplary embodiment of the power semiconductor device 1 is shown. It can be seen that the extraction electrode 34 is formed by a plurality of contact points 52. The contact points 52 can be comparably small, for example, can have a size of at most 4 µm×4 µm or of at most 2 µm×2 µm. The contact points 52 are arranged along a straight line which is an axis of mirror symmetry, seen in top view of the top side 20, with respect to the adjacent active cells 5. For example, the contact points 52 make for at most 5% of the straight line.

Otherwise, the same as to FIGS. 1 to 15 may also apply to FIG. 16, and vice versa.

In FIG. 17, a block diagram of a method to produce the power semiconductor device 1 is illustrated. In a method step S1, the semiconductor body 2 is provided. For example, in method step S1 the semiconductor body 2 has the drift region 23 which is of a first conductivity type.

According to subsequent method step S2, the enhancement region 26 and the barrier region 28 which are of the first conductivity type are created. For example, the enhancement region 26 and the barrier region 28 are created simultaneously.

In method step S3, creating the well region 22 and the extraction region 27 which are of a second conductivity type follows. The well region 22 and the extraction region 27 may also be created simultaneously.

Then, in method step S4 the source region 21 which is of the first conductivity type is created, followed by method step S5 in which the gate electrode 31 is applied at the well region 22 and the extraction electrode 34 is applied at the extraction region 27 and/or at the barrier region 28.

Although in FIG. 17 method step S3 follows method step S2, it is alternatively possible that method step S2 follows method step S3. Further, method step S4 may be done before method step S2 and/or S3.

Otherwise, the same as to FIGS. 1 to 16 may also apply to FIG. 17, and vice versa.

The components shown in the figures follow, unless indicated otherwise, exemplarily in the specified sequence directly one on top of the other. Components which are not in contact in the figures are exemplarily spaced apart from one another. If lines are drawn parallel to one another, the corresponding surfaces may be oriented in parallel with one another. Likewise, unless indicated otherwise, the positions of the drawn components relative to one another are correctly reproduced in the figures.

The term 'and/or' describes only an association relationship for describing associated objects and represents that three relationships may exist. For example, A and/or B may represent the following three cases: Only A exists, both A and B exist, and only B exists; the same applies analogously if there are more than three entities.

The power semiconductor device described here is not restricted by the description on the basis of the exemplary embodiments. Rather, the power semiconductor device encompasses any new feature and also any combination of features, which includes any combination of features in the patent claims, even if this feature or this combination itself is not explicitly specified in the patent claims or exemplary embodiments.

This patent application claims the priority of European patent application 21216358.8, the disclosure content of which is hereby incorporated by reference.

LIST OF REFERENCE SIGNS 1 power semiconductor device
2 semiconductor body
20 top side
21 source region
22 well region
23 drift region
24 plug
25 collector region
251 drain region
26 enhancement region
27 extraction region
28 barrier region
29 deep doping region
31 gate electrode
32 source electrode
33 collector electrode
331 drain electrode
34 extraction electrode
35 drain electrode
4 gate insulator
42 field oxide
5 active cell
51 stripe of the gate electrode
52 contact point of the extraction electrode
53 line of the source electrode
6 unit cell
10 first modification of a power semiconductor device
11 second modification of a power semiconductor device
Aint integrated avalanche generation in $cm^{-2} s^{-1}$
Amax maximum avalanche generation in $cm^{-3} s^{-1}$
C current in A
Eoff energy loss during turn-off in J
i number of pulses in thousand
I impact ionization $cm^{-3} s^{-1}$
n doping concentration in $cm^{-3}$
P avalanche peak
S . . . method step
T time in s
U voltage in V
X, Y lateral and height coordinates in μm

The invention claimed is:

1. A power semiconductor device comprising a semiconductor body, a gate electrode, a source electrode and an extraction electrode, the gate electrode is separated from the semiconductor body by a gate insulator which is electrically insulating, wherein the semiconductor body comprises:
  a source region of a first conductivity type directly at the source electrode and directly at the gate insulator,
  a well region of a second conductivity type different from the first conductivity type directly at the gate insulator and directly at the source region,
  a drift region which is of the first conductivity type that electrically follows the well region at a side remote from the source region and is directly at the gate insulator,
  an extraction region directly at the extraction electrode which is of the second conductivity type, and
  a barrier region assigned to the extraction electrode which is of the first conductivity type, the barrier region is located directly between the drift region and the extraction electrode (34) so that the extraction region is located between the barrier region and the extraction electrode and is surrounded all around by the barrier region which forms a well the extraction region is located in, and the barrier region is distant from the gate insulator,
  wherein the well region and the extraction region have the same maximum doping concentrations and/or the same doping depth profile.

2. The power semiconductor device according to claim 1, wherein the semiconductor body further comprises a deep doping region which is of the second conductivity type, the deep doping region is located between the barrier region and at least part of the drift region,
  wherein a depth of the deep doping region into the semiconductor body exceeds a depth of the well region.

3. The power semiconductor device according to claim 2, wherein the deep doping region is located directly at least at some lateral sides of the barrier region,
  wherein a maximum doping concentration of the deep doping region exceeds a maximum doping concentration of the well region by at least a factor of two.

4. The power semiconductor device according to claim 2, wherein a bottom side of the barrier region is at least partially free of the deep doping region.

5. The power semiconductor device according to claim 2, wherein the gate electrode is accommodated in a trench,
  wherein the gate electrode extends deeper into the semiconductor body than the well region,
  wherein the deep doping region extends at least as far into the semiconductor body as the gate electrode.

6. The power semiconductor device according to claim 1, wherein the semiconductor body further comprises an enhancement region which is of the first conductivity type,
  wherein the enhancement region is located directly at a bottom side of the well region so that the enhancement region is located between the drift region and the well region, wherein a maximum doping concentration of the enhancement region exceeds a maximum doping concentration of the drift region by at least a factor of two.

7. A method to produce a power semiconductor device according to claim 6, the method comprising:
   providing the semiconductor body having the drift region which is of the first conductivity type,
   simultaneously creating the enhancement region and the barrier region which are of the first conductivity type,
   simultaneously creating the well region and the extraction region which are of the second conductivity type different from the first conductivity type,
   creating a source region which is of the first conductivity type, and
   applying the source electrode at the source region, the gate electrode at the well region and the extraction electrode at the extraction region, the barrier region is located directly between the drift region and the extraction electrode.

8. The power semiconductor device according to claim 1, wherein the gate electrode is accommodated in a trench, wherein the gate electrode extends deeper into the semiconductor body than the well region.

9. The power semiconductor device according to claim 1, wherein, seen in top view of the semiconductor body, the gate electrode comprises 2N stripes, N is a natural number larger than or equal to one,
   wherein the 2N stripes define N active cells of the power semiconductor device.

10. The power semiconductor device according to claim 9,
    wherein the source electrode comprises N lines,
    wherein, seen in top view of the semiconductor body, each one of the N lines is assigned to one of the N active cells and is located between the respective two stripes of the gate electrode.

11. The power semiconductor device according to claim 9,
    wherein N is a natural number larger than or equal to two,
    wherein the extraction electrode comprises a plurality of contact points,
    wherein, seen in top view of the semiconductor body, the contact points are arranged in each case between two adjacent active cells.

12. The power semiconductor device according to claim 11,
    wherein, seen in top view of the semiconductor body, the contact points are arranged along a straight line,
    wherein the contact points fill at most 5% of the straight line, and
    wherein a length of each one of the contact points along the straight line is at most 50% of a distance between the adjacent active cells.

13. The power semiconductor device according to claim 1,
    wherein the semiconductor body further comprises a plug which is of the second conductivity type,
    wherein the plug is configured to electrically contact the well region,
    wherein the source region, the plug and the extraction electrode are configured to be at the same electric potential.

14. The power semiconductor device according to claim 1,
    which is an insulated-gate bipolar transistor, IGBT, configured for a voltage of at least 0.65 kV between a drain electrode and an emitter electrode of the IGBT.

* * * * *